(12) United States Patent
Furuya et al.

(10) Patent No.: US 8,095,842 B2
(45) Date of Patent: Jan. 10, 2012

(54) RANDOM ERROR SIGNAL GENERATOR

(75) Inventors: Takashi Furuya, Tama (JP); Masahiro Kuroda, Atsugi (JP); Hiroshi Shimotahira, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 171 days.

(21) Appl. No.: 12/510,423

(22) Filed: Jul. 28, 2009

(65) Prior Publication Data
US 2010/0031105 A1 Feb. 4, 2010

(30) Foreign Application Priority Data
Jul. 30, 2008 (JP) ................................. 2008-196395

(51) Int. Cl.
*G01R 31/3183* (2006.01)
(52) U.S. Cl. ........................................ 714/736; 714/739
(58) Field of Classification Search ........................ None
See application file for complete search history.

(56) References Cited

U.S. PATENT DOCUMENTS
6,772,378 B1 * 8/2004 Ishihara et al. ............... 714/704
2002/0120897 A1 * 8/2002 Eby .............................. 714/738

FOREIGN PATENT DOCUMENTS
JP 2002-330192 A 11/2002

* cited by examiner

*Primary Examiner* — Jeffrey A Gaffin
*Assistant Examiner* — Dipakkumar Gandhi
(74) *Attorney, Agent, or Firm* — Holtz, Holtz, Goodman & Chick, PC

(57) ABSTRACT

In a random error signal generator, an M-sequence generation circuit outputs, in parallel, pieces of bit data stored in each register, a first generation circuit sequentially outputs first reference values C which are changed by a predetermined value in response to clocks, a second generation circuit outputs a second reference value D which is shifted from the first reference value C by a range value E which is determined depending on an error rate p. A comparison and determination unit outputs random error signals to be error bits when a numeric value A of the bit data output exists between the first and second reference values C, D. The random error signal has the error rate p, the number of times of error occurrences follows Poisson distribution, and a distribution of adjacent error occurrence intervals follows a geometric distribution.

7 Claims, 11 Drawing Sheets

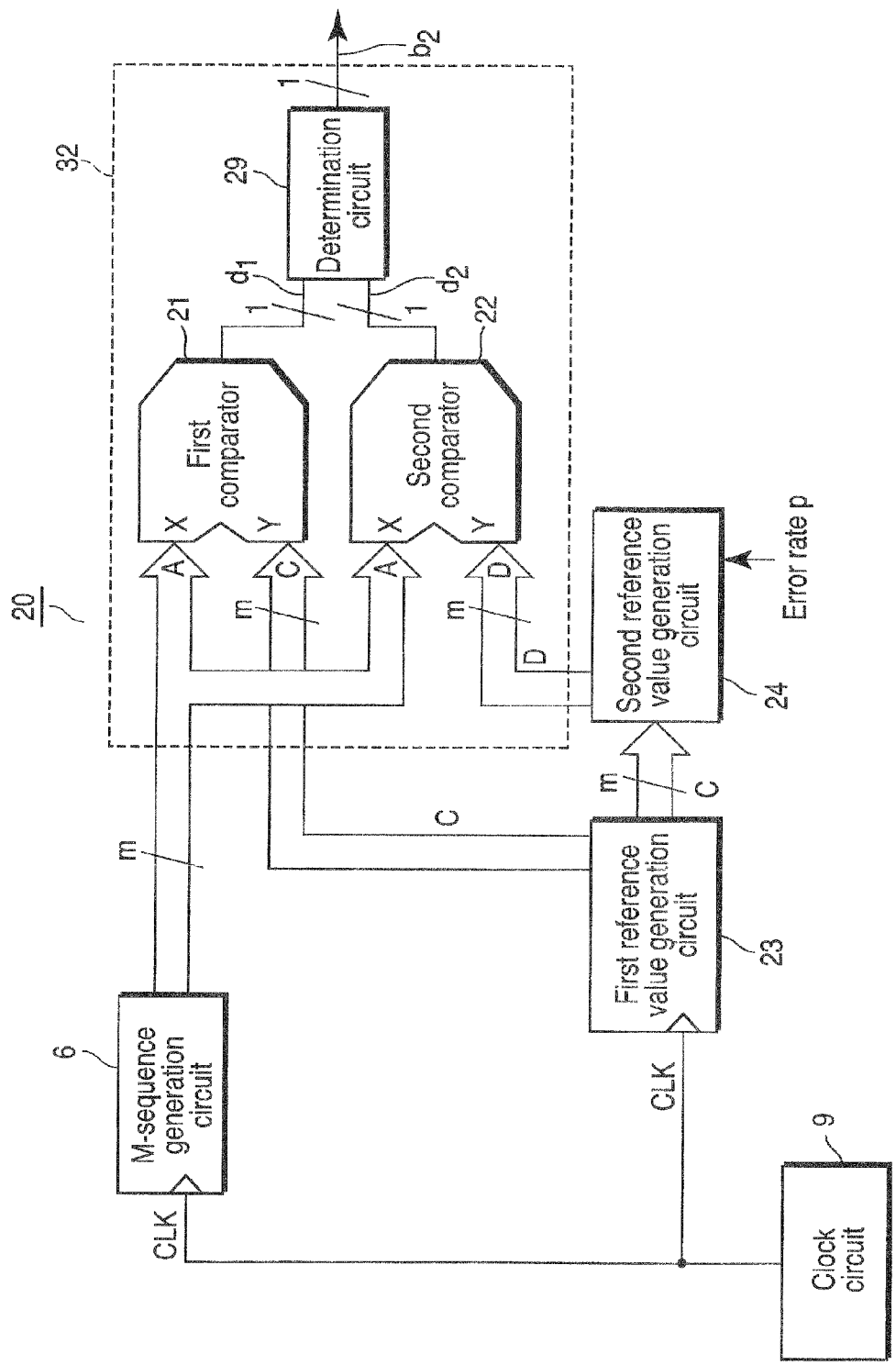
F I G. 1

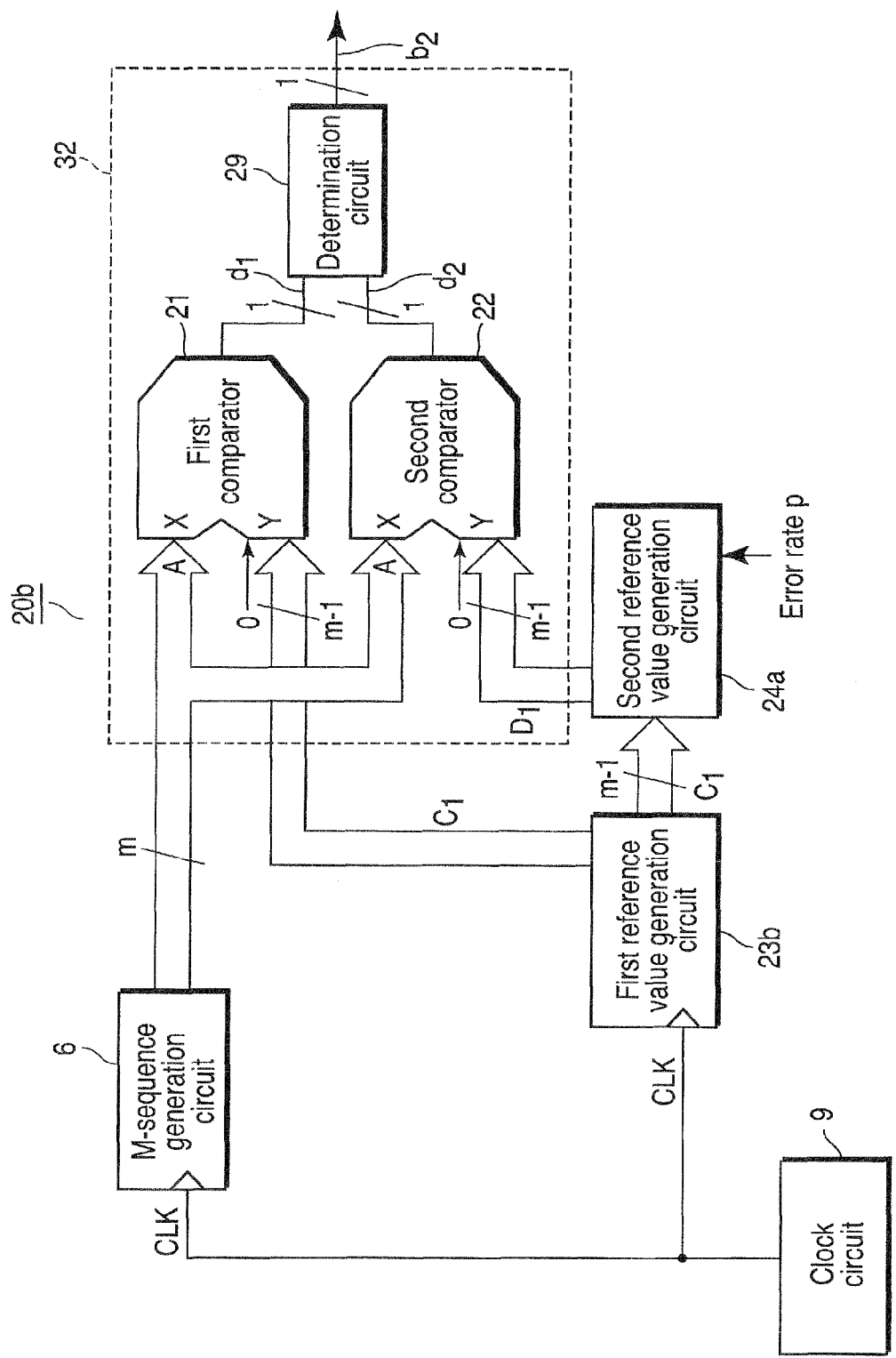
F I G. 12

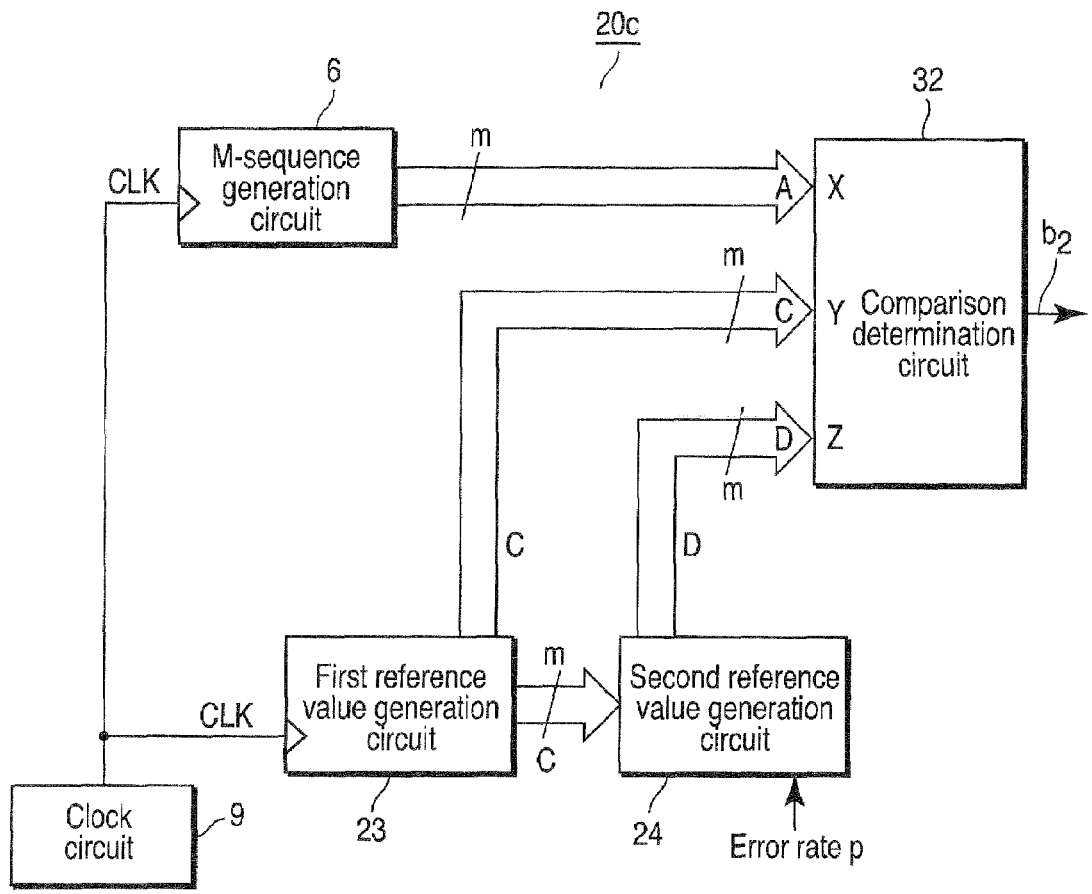
F I G. 13
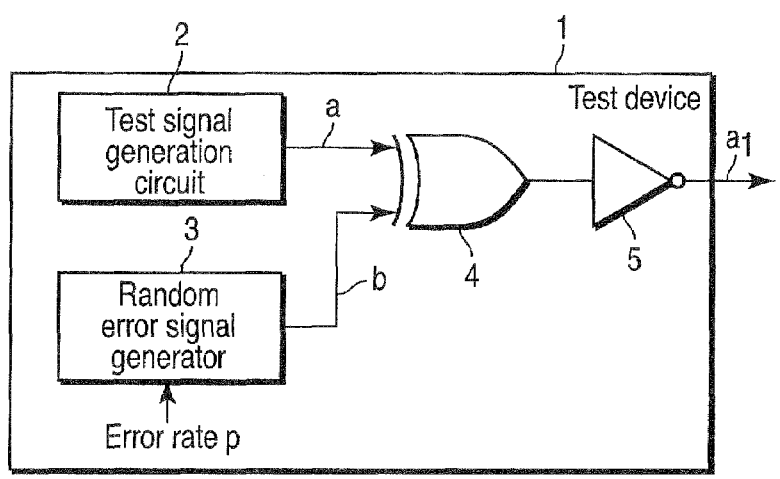
F I G. 14

RANDOM ERROR SIGNAL GENERATOR

CROSS-REFERENCE TO RELATED APPLICATIONS

This application is based upon and claims the benefit of priority from prior Japanese Patent Application No. 2008-196395, filed Jul. 30, 2008, the entire contents of which are incorporated herein by reference.

BACKGROUND OF THE INVENTION

1. Field of the Invention

This invention relates to a random error signal generator for generating random error signals having specified error rates, of which the number of error occurrence times follows Poisson distribution within a predetermined counting time period, and of which the occurrence time interval of adjacent two errors follows geometric distribution.

2. Description of the Related Art

There have been developed test apparatuses for performing various tests to sets of communication equipment incorporated in digital communication networks using generic electric signal cables or optical communication networks using optical fiber cables. These test apparatuses input test signals matching with actual use situations of the communication equipment to he tested to evaluate response operations of the communication equipment. In terms of one of evaluation tests to such communication equipment, there is an evaluation test of generating a test signal to which errors are intentionally included as a test signal which matches with an actual use situation and sending the test signal to the communication equipment to be measured. In the evaluation test, a maximum error rate that the communication equipment works well is examined.

Origin of errors in various digital communication networks such as connecting among generic user terminal and a base station, or connecting among subscriber terminals and a telephone station, etc. is manifold In a network connecting among base station mutually, errors are mainly due to external noise. Usually, an error occurrence rate (error rate) p included in the digital signal is in the order of $p=10^{-2}$ to $10^{-8}$, and also these errors are generated at random.

If the word "random" is expressed in different word "unpredictable", the number of errors occurring in a predetermined counting time is unpredictable and a time interval from an occurrence of one error to an occurrence of the next error (referred to as an error occurrence interval) is also unpredictable. The former property concerning the number of times of the error occurrences is referred to as unpredictability of a counting property, and the latter property concerning the error occurrence interval is referred to as unpredictability of an interval property.

Therefore, as shown in FIG. 14, a test apparatus 1 includes a random error signal generator 3 other than a test signal generator circuit 2 generating an original digital test signal a. The random error signal generator 3 generates a random error signal b in which, errors, for example, of [1] bit occur at a specified error occurrence rate (error rate) p and also at random. An exclusive OR gate 4 applies exclusive OR arithmetic operation to the digital test signal output from the generation circuit 2 and the random error signal b output from the random error signal generator 3, an inverter 5 inverts he result of the arithmetic operation to generate a test signal $a_1$ including errors at the specified error occurrence rate p.

Statistic properties of the errors occurred in the random error signal will be verified by using a probability theory hereinafter. That is, in the random error signal, it is impossible to determine whether or not errors occur at one clock cycle $T_C$. However, an occurrence probability of errors in the random error signal is set to a fixed value p. A random error occurrence circuit for generating such random error signals may be assumed to be a device which repeats independent Bernoulli Trials of a population parameter (occurrence rate) p at a certain fixed cycle by using a term of the probability theory.

The Bernoulli Trials of the population parameter p are trials of a probability of a success of $p(0<p<1)$, and of a probability of a failure of $q=(1-p)$. The Bernoulli Trials output [1] when they success, and output [0] when they fail. The word "independent" means that the results of the respective trials do not affect on the results from other than them (results of other trials).

When the Bernoulli Trials of the population parameter p are repeated, the number of trial times from the [1] is output until the [1] will be output next follows a probability distribution and the distribution may be expressed in a geometric distribution. That is, the geometric distribution is equivalent to a probability distribution obtained by repeating the Bernoulli Trials of the population parameter (probability) $p(0<p<1)$, and a probability P (j, p) in which the number of trials from the success (output [1]) to the next success (output [1]) becomes j is expressed by the following equation.

$$p(j, p)=q^j \times p \; j=0, 1, 2, 3, \ldots$$

wherein, $q=1-p \; 0<q<1$

In this way, the distribution of error intervals of the respective errors (interval from one error occurrence up to an occurrence of the next error) included in the random error signal follows the geometric distribution in theory.

Thus, the following two view points evaluate whether or not the respective errors included in the random error signals may be assumed to actually occur at random.

(a) The number of times of error occurrences in a predetermined counting time follows a binomial distribution. Evaluation of the random error signals from this point of view means to examine the counting property of the errors as mentioned previously. However, since the foregoing binomial distribution gradually approaches to Poisson distribution at a limit in which a counting time is fully long and the error rate p is fully small, if the binomial distribution gradually approaches to Poisson distribution, the number of times of the error occurrences may be assumed to follow Poisson distribution. Hereinafter, the following of the number of times of the error occurrences within the predetermined counting time to Poisson distribution is referred to as a satisfaction of the counting property by the random error signal. This Poisson distribution $P(k, \lambda)$, the probability that a random variable takes a value k, is generally expressed by the following equation.

$$P(k, \lambda)=(e^{-\lambda} \times \lambda^k)/k!$$

wherein $\lambda$; averaged value (b) An interval between an occurrence time of a certain error and an occurrence time of another error (for simplification, this amount is referred to as error occurrence interval) follows a predetermined distribution. Especially, be interval between two adjacent errors should follow the foregoing geometric distribution. Evaluation of a random property of the random error signal from this point of view means to examine the interval property of the errors as mentioned above. Hereinafter, the following of the adjacent errors occurrence interval with a geometric distribution is referred to as the satisfaction of the interval property by the random signal.

An example of an error signal generation circuit generating the random error signals, of which the number of times of error occurrences within the predetermined counting time mentioned in the (a) follows Poisson distribution, is described in Jpn. Pat. Appln. KOKAI publication No. 2002-330192. However, a detailed configuration of such a random error signal generator is not described in Jpn. Pat. Appln. KOKAI publication No. 2002-330192, it may be estimated, from the specification and the drawings, that the random error signal generator 3 has a configuration to be shown in FIGS. 15 and 16.

As an example is shown in FIG. 16, an M-sequence generation circuit 6 shown in FIG. 15 is composed of registers 7 serially connected in a manner of m stages and one or more exclusive OR gates 8. When an external clock circuit 9 applies a clock CLK to each register 7, the M-sequence generation circuit 6 outputs pseudo random signals that are digital serial signals having a cycle of $(2^m-1)$ from an output terminal 10.

At every input of the clock CLK, each piece of bit data (pseudo random binary sequence) stored in each register 7 is output in parallel with one another. Each piece of bit data output from the M-sequence generation circuit 6 in parallel with one another is applied to one input terminal (X terminal) of a comparator 11. Reference values of parallel m-bit input by an operator through a reference value generation circuit 12 are input to the other input terminal (Y terminal).

The comparator 11 loads, as one numeric value A, paralleled m pieces of bit data applied to one input terminal (X terminal). Similarly, the comparator 11 loads, as one numeric value, a reference value B of paralleled m-bit applied to the other input terminal (Y terminal). If the numeric value A loaded from one input terminal (X terminal is not larger than the reference value B loaded from the other input terminal (Y terminal), the comparator 11 outputs a random error signal b to be an error bit.

The reference value B is set so that the random error signal b output from the random error signal generator 3 becomes the error occurrence rate (error rate) p to be targeted. As given above, since the numeric value A takes a integer value one or more and less than $(2^m-1)$ only each one time in one cycle, to set the error rate to p, the reference value B is set to an integer value that is closest to $(2^m-1) \times p$.

For instance, in a case where the error rate E is 0.004 (0.4%), and the integer value which can be taken from the X terminal is 1 to 1,000, the reference value B is set to [4]. Since the numeric value A becoming smaller than [4] has a probability of 4/1,000, the random error signal b having the error rate E of 0.004 may be obtained.

The random error signal generators 3 shown in FIGS. 15 and 16 still have the following problems to be solved. That is, the error occurrence rate (error rate) of the random error signal b output from the random error signal generator 3 is able to conform the error occurrence rate (error rate) of the random error signal b to the accurately specified error occurrence rate (error rate) p. However, the generated random error signals do not satisfy the counting property shown in the foregoing Poisson distribution and the interval property shown in the geometric distribution. Referring now to FIG. 17, the reason why the random error signals do not satisfy the interval property will be described hereinafter.

FIG. 17 shows a time chart showing operations of the random error signal generator 3 shown in FIGS. 15 and 16. However, in FIG. 17, the number of stages m of the registers 7 configuring the shift register shown in FIG. 16 is described as 10(m=10) As shown at (a) of FIG. 17, when one clock CLK is input, the pseudo random signal is output from the output terminal 10 of the M-sequence generation circuit 6 as shown at (b) of FIG. 17. As shown at (B) of FIG. 17, if a part of the pseudo random signal is, for example,[. . . , 00010000 00000, . . .], and if the paralleled m pieces (bits) (m=10) of data output from each register is [1000000000], the numeric value A of the m pieces (bits) of data is [1]. As shown at (c) of FIG. 17, if the reference value B is [4], since the numeric A is less than the reference value B, the output from the comparator 11 becomes an error bit of [1] as shown at (d) of FIG. 17.

As shown at (a) of FIG. 17, when the next clock CLK is input, since the data of each register 7 shifts one by one, the paralleled m(=10) pieces of data becomes [0100000000]. The numeric value A of this m(=10) pieces (bits) of data is [2] as shown at (b) of FIG. 17. As shown in FIG. 17 (c), since the reference B is fixed to [4], the output from the comparator 11 is still remained at an error bit of [1] as shown at (d) of FIG. 17.

Further, as shown at (a) of FIG. 17, when the next clock CLK is input, since the data of each register 7 shifts one by one, the paralleled m(=10) pieces (bits) of data becomes [0010000000] as shown at (b) of FIG. 17, and the numeric value A of the m(=10) pieces (bits) is equivalent to [4]. As shown at (c) of FIG. 17, since the reference value B is [4], the output from the comparator 11 remains the error bit of [1] as shown at (d) of FIG. 17

Further, as shown at (a) of FIG. 17, when the next clock CLK is input, since the data of each register 7 shifts one by one, the paralleled m(=10) pieces (bits) of data becomes [0001000000], and the numeric value (data numeric value) A of the data of this m(=10) pieces (bits) is equivalent to [8]. As shown at (c) of FIG. 17, since the reference value B is [4], the output from the comparator 11 changes into a normal bit of [0] as shown at (d) of FIG. 17.

In this way, solely the case in which at least one of each register 7 connected to an exclusive OR gate 8 is equivalent to a value [1] breaks the shift relationship between each register 7, and otherwise the shift relationship is reserved long in synchronization with the clock CLK. Therefore, if the error bit of [1] is generated once, there is every possibility of generating the error bits of [1] successively. Then, the normal bits of [0] continue for a long time.

This means the error distribution of the random error signal b output from the random error signal generator 3 concentrates to a specified time position, and this results in large deflection from Poisson distribution. That is, a problem is posed, which the random error signal b output from the random error signal generator 3 does not satisfy the counting property. The random error signal generator 3 also poses a problem that the distribution of the adjacent error occurrence intervals showing the interval between a certain error occurrence time and an occurrence time of another error largely deflected from the geometric distribution and that the random error signal does not satisfy the interval property.

BRIEF SUMMARY OF THE INVENTION

An object of the invention is to provide a random error signal generator for satisfying a counting property and an interval property by enabling an error rate of output random error signals to be synchronized with a specified error rate, by enabling an error distribution of generated errors to further approximate Poisson distribution, and further by approximating an adjacent error occurrence interval of generated error a geometric distribution.

According to the present invention, there is provided a random error signal generator, comprising a clock circuit outputting clocks at predetermined cycles; an M-sequence generation circuit outputting a plurality of pieces of bit data stored in each register in response to inputs of clocks output from the clock circuit; and a comparison and determination unit outputting random error signals including an error bit by making a comparison between the bit data output from the M-sequence generation circuit and a reference value, wherein the reference value consists of a first reference value and a second reference value, the random error signal generator further comprising: a first reference value generation circuit sequentially outputting the first reference values changing their values by a predetermined value at every input of the clock; and a second reference value generation circuit sequentially outputting the second reference value, which has been shifted by a range value defined in correspondence to a specified error rate to the first reference value sequentially output in synchronization with the clocks, from the first reference value generation circuit, wherein the comparison and determination unit takes in, as one numeric value, a plurality of pieces of bit data sequentially output from the M-sequence generation circuit in parallel, and outputs, in synchronization with the clocks, random error signals to be error bits If the separately taken numeric value exists between the first reference value and the second reference value.

According to the invention, there is provided a random error signal generator, wherein the comparison and determination unit comprises: a first comparator which receives, at one end, the plurality of pieces of bit data to he sequentially output in parallel from the M-sequence generation circuit, takes in the input plurality of pieces of bit data as one numeric value, and outputs a lower side determination signal when the numeric value is equal to or larger than the first reference value input to the other end; a second comparator which receives, at one end, the plurality of pieces of bit data to be sequentially output in parallel from the M-sequence generation circuit, takes in the input plurality of pieces of bit data as one numeric value, and outputs an upper side determination signal when the numeric value is equal to or smaller than the second reference value input to the other end; and a determination circuit which outputs the random error signals to be the error bits in synchronization with the clocks when the first comparator outputs a lower side determination signal and when the second comparator simultaneously outputs an upper side determination signal.

In the random error signal generator configured in this way, the first reference values sequentially output from the first reference value generation circuit in synchronization with the clocks are not constant fixed values corresponding to a targeted error rate to be output from the conventional reference value generation circuit shown in FIG. 15, but changes the values by a predetermined value whenever the clock is input. The second reference values sequentially output from the second reference value generation circuit in synchronization with the clocks have values in which range values corresponding to the specified error rates are added to the first reference value.

That is, displaying the first and the second reference values with setting of the clock as a lateral axis, a parallel relationship between the first and the second reference values is maintained. The interval between the first and the second reference values is a range value of a constant fixed value corresponding to the targeted error rate output from the reference value generation circuit of the conventional device shown in FIG. 15.

Therefore, a numeric value at each clock input to each one end of the first and the second comparator from the M-sequence generation circuit is either in the range between the first and the second reference values, or out of it. Since the range value is corresponding to the targeted error rate, the probability existing within the range becomes the targeted error rate. Thus, the error rates of the random error signals output from the determination circuit become the specified error rates.

Further, comparing a change extent of the outputs from the M-sequence generation circuit with a change extent of the first and the second reference values, the latter can change more rapidly than the former, because the reference values grow with an adaptive increment.

Therefore, even if the numeric values input to each one end of the first and the second comparators do not change so much, since the first and the second reference values input to each another end largely change, the continuation of bits of [1] indicating the errors is suppressed in the random error signals output from the determination circuit, the error distribution generated in the random error signals output from the determination circuit may be further approximated to Poisson distribution, and further, the adjacent error generation interval of the generated errors may be approximated to the geometric distribution.

In another invention, the first reference value generation circuit in the random error signal generator of the foregoing invention includes a second M-sequence generation circuit, which outputs a plurality of bits of data at each time a clock is inputted. This second M-sequence generation circuit is set to generate a difference M-sequence from that the previously mentioned M-sequence generation circuit outputs.

The random error signal generator configured in this way changes the first reference value, which is output from the first reference value generation circuit in synchronization with the clock, at random, in comparison with the fact in which the first reference value output from the first reference value generation circuit of the foregoing invention changes in proportion to the clock. As a result, this random error signal generator enables approximating the error occurrences in the random error signal output from the determination circuit to Poisson distribution and the geometric distribution.

In the random error signal generator of the foregoing invention, the M-sequence generation circuit outputs bit data of an m-digit number in parallel, the first and the second reference value generation circuits output the signals of the first and the second reference values of (m−1) digits smaller than the digit number of the bit data of m-digit number by one digit to a comparison determination unit, and the fixed values of [0] as the most significant digits are input in the random error signal generator of the foregoing invention, the M-sequence generation circuit outputs bit data of an in digit number in parallel, the first and the second reference value generation circuits output signals of the first and the second reference values of (m−1) digits smaller than the number of digits of the bit data of the m digit number by one digit to the comparison and determination unit, and the first and the second comparators receives a fixed value of [0] as the most significant digit.

That is, the numeric value output from the first reference value generation circuit does not exceed a maximum value $2^m$ which can be set as a numeric value of an m-digit input to one end of each comparator.

Another invention includes a selection means for selecting and setting a predetermined value changing its value at every input of a clock of the first reference output from the first reference value generation circuit in the random error signal generator of the foregoing invention.

Moreover, a random error signal generator of further invention comprises a clock circuit outputting clocks having predetermined cycles, an M-sequence generation circuit having a plurality of serially connected registers, and outputting, in parallel at every input of a clock, a plurality of pieces of bit data stored in each register, a first reference value generation circuit sequentially outputting a first reference value changing by a predetermined value at every input of the clock, a second reference value generation circuit sequentially outputting, in synchronization with the clocks, a second reference value which has shifted by a range value corresponding to a specified error rate from the first reference value sequentially output from the first reference value generation circuit in synchronization with the clocks, and a comparison and determination unit taking in, as one numeric value, a plurality of pieces of bit data sequentially output in parallel from the M-sequence generation circuit, and outputting, in synchronization with the clocks, random error signals to be error bits when the numeric value exists between the separately taken first and second reference values.

In the random error signal generator configured in such a way, one comparison and determination unit integrates the functions of the first comparator, the second comparator, and the determination circuit of the is aforementioned invention.

BRIEF DESCRIPTION OF THE SEVERAL VIEWS OF THE DRAWING

FIG. 1 is a block diagram showing a schematic configuration of a random error signal generator according to a first embodiment of the invention;

FIG. 12 is a block diagram showing a schematic configuration of a random error signal generator according to a third embodiment of the invention;

FIG. 13 is a block diagram showing a schematic configuration of a random error signal generator according to a fourth embodiment of the invention;

FIG. 14 is a circuit view showing a schematic configuration of a conventional test apparatus provided with a random error signal generator;

DETAILED DESCRIPTION OF THE INVENTION

Hereinafter, a random error signal generator according to an embodiment of the invention will be described with reference to the drawings.

First Embodiment

FIG. 1 shows a block diagram illustrating a schematic configuration of a random error signal generator according to a first embodiment of the invention. Identical symbols are designated to the same components as those of a conventional random error signal generator shown in FIG. 15 and the detailed description thereof will be omitted.

Figure 2:
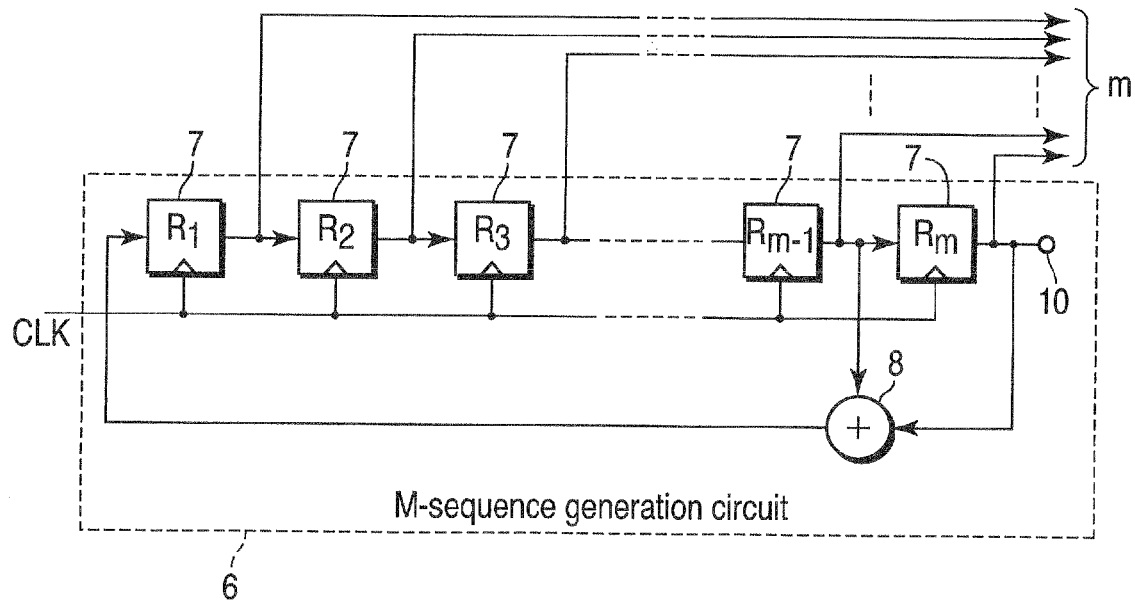
FIG. 2 is a circuit diagram showing a configuration of a M-sequence generation circuit incorporated in the random error signal generator shown in FIG. 1.

An M (the longest)-sequence generation circuit 6 incorporated in a random error signal generator 20 according to the first embodiment is composed of registers 7 having m-stages and one or more exclusive OR gates 8, as shown in FIG. 2. When a clock CLK is applied to each register 7 from an external clock circuit 9, the M-sequence generation circuit 6 outputs pseudo random signals having a cycle of ($2^m-1$) from an output terminal 10 of the circuit 6. At every input of the clock CLK, the M-sequence generation circuit 6 outputs, in parallel with one another, each bit data stored in each register 7 of m pieces.

Each bit data of m pieces output from the M-sequence generation circuit 6 in parallel is applied to each one input terminal (X terminal) of a first comparator 1 and a second comparator 2 with the identical configurations.

A first reference value generation circuit 23 applies a first reference value signal having a first reference value C of a m-bit configuration sequentially increasing its value by a predetermined value at every input of the clock CLK from the clock circuit 9 to the other input terminal (Y terminal) of the first comparator 21 and also applies the first reference value signal to a second reference value generation circuit 24.

Figure 3:
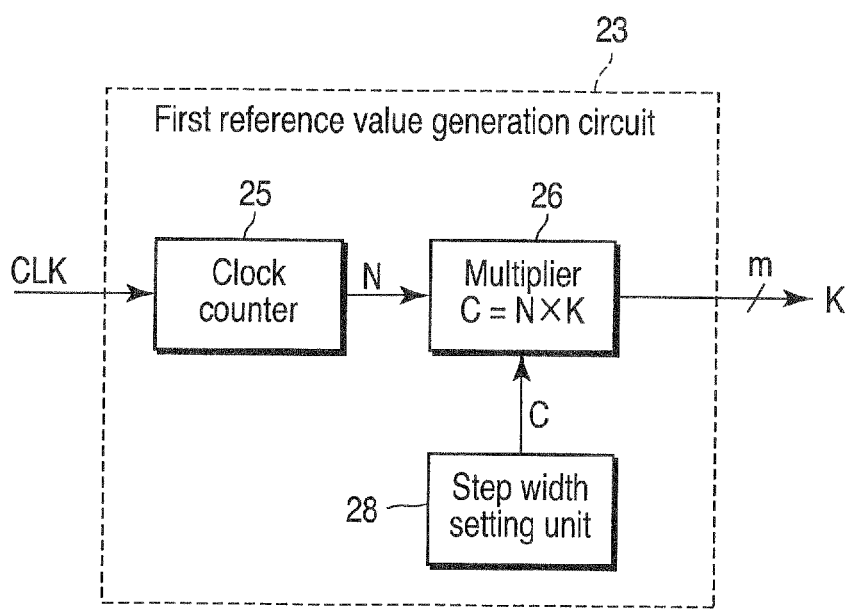
FIG. 3 is a block diagram showing a configuration of a first reference value generation circuit incorporated in the random error signal generator shown in FIG. 1.

FIG. 3 shows a block diagram illustrating a detailed configuration of the first reference value generation circuit 23 shown in FIG. 1. A clock counter 25 counts input clocks to send the number N of counted clocks to a multiplier 26. The multiplier 26 multiplies the number N by a predetermined value K to obtain a first reference value $C(=N \times K)$, applies the first reference value C to the other input terminal (Y terminal) of the first comparator 21, and also applies the value C to the second reference value generation circuit 24. Since the first reference value C is obtained by multiplying the number N by the predetermined value K, the value C increases by a predetermined value (step width) at every input of the clock CLK. The predetermined value (step width) K may be arbitrarily settable by means of a step width setting unit 28.

The second reference value generation circuit 24 calculates a second reference value D with a m-bit configuration, in which the first reference value C sequentially output from the first reference value generation circuit 23 in synchronization with the clock CLK, is added by a certain range value E, and applies the second reference signal having the second reference value D to the other input terminal (Y terminal) of the second comparator 22 in synchronization with the clock CLK. In the second reference value generation circuit 24, the certain range value E is generated in correspondence to the specified (target) error rate p which is externally specified, and the second reference, within the range of the range value E at the specified error rate p, is generated.

The first comparator 21 takes in, as one numeric value A, paralleled m pieces (bits) of data which has been applied to one input terminal (X terminal) from the M-sequence generation circuit 6. Similarly, the first comparator 21 also takes in, as a numeric value, the first reference value C of paralleled m-bit which has been applied to the other input terminal (Y terminal) from the first reference value generation circuit 23. If the numeric value A taken from one input terminal) (X terminal) is not smaller than the first reference value C taken from the other input terminal (Y terminal), the first comparator 21 sends a lower side (limit) determination signal $d_1$ of [1] to a determination circuit 29.

The second comparator 22 takes in, as one numeric value A, paralleled m pieces (bits) of data which has been applied to one input terminal (X terminal) from the M-sequence generation circuit 6. Similarly, the second comparator 22 takes in, as a numeric value, a paralleled m-bit second reference value D which has been applied to the other input terminal (Y terminal) from the second reference value generation circuit 24. If the numeric value A taken from one input terminal (X terminal) is not larger than the second reference value D taken from the other input terminal (Y terminal), the second comparator 22 sends an upper side (limit) determination signal $d_2$ of [1] to the determination circuit 29.

For instance, the determination circuit 29 is composed of an AND gate, and outputs the random error signal $b_1$ to be an error bit of [1] in synchronization with the clock CLK only when the lower side determination signal $d_1$ of [1] is input from the first comparator 21 and the upper side determination signal $d_2$ of [1] is input from the second comparator 22 simultaneously.

In the random error signal generator 20, which is configured in this way, of the first embodiment, the first reference value C sequentially output from the first reference value generation circuit 23 in synchronization with the clock CLK increases by the predetermined value K at every input of the clock CLK (C=N×K). The second reference value D sequentially output from the second reference value generation circuit 24 in synchronization with the clock CLK is decided to a value (D=C+E) in which the first reference value C is added by the range value E defined in correspondence to the specified error rate.

Figure 4:
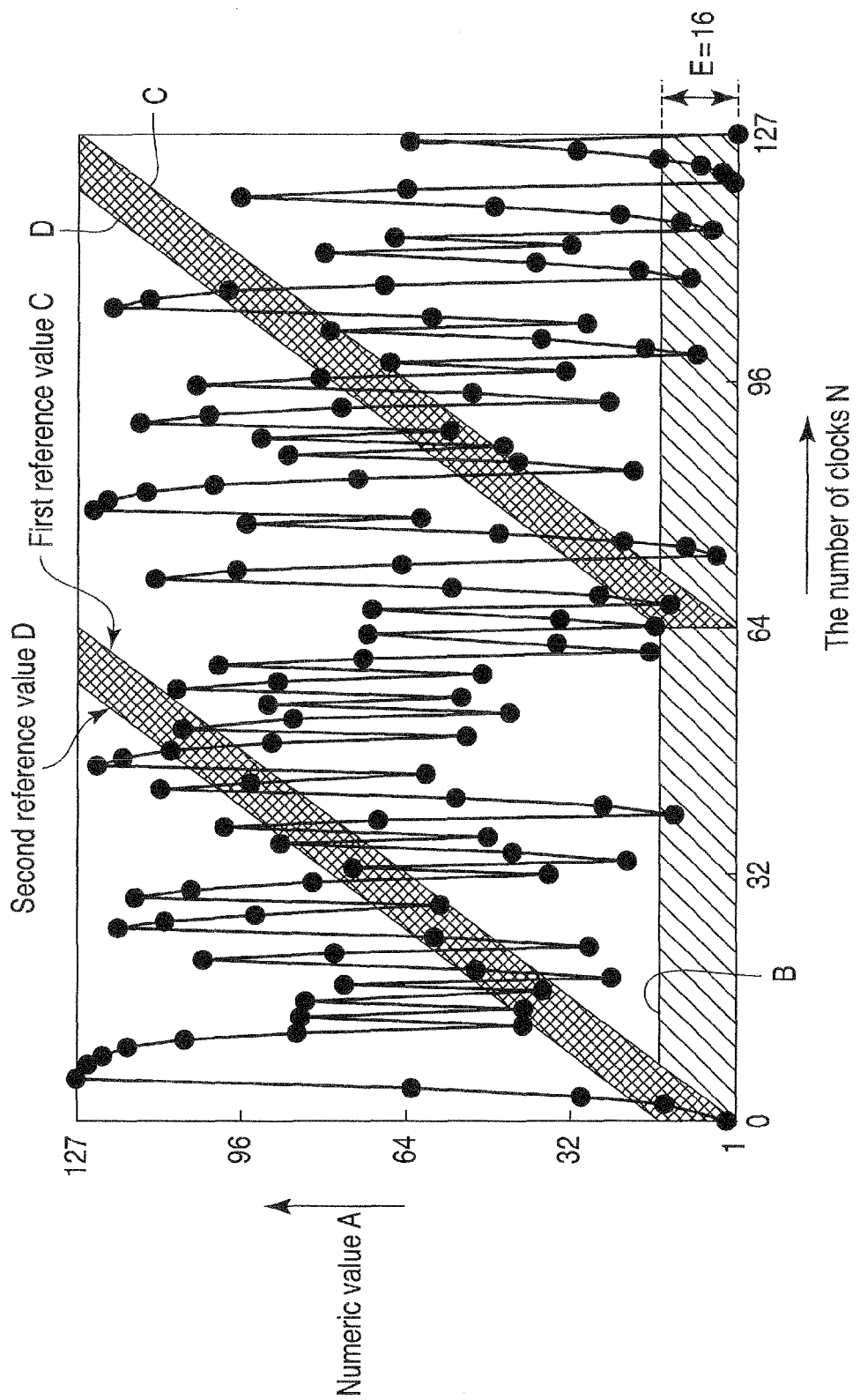
FIG. 4 is an exemplary graph showing a relationship among changes in reference values output from the first and the second reference value generation circuits incorporated in the random error signal generation circuit shown in FIG. 1.

FIG. 4 shows a graph illustrating a relationship among changes in time shown by the number of N of clocks on the numeric value A input to each one input terminal (X terminal) of the first and the second comparators 21, 22, the first reference values C (=N×K) and the second reference values D (=C+E). In FIG. 4, codes B are represented in order to compare the reference values B that are fixed values output from the reference value generation circuit 12 in the conventional random error signal generator 3 shown in FIG. 15.

In FIG. 4, the number m of the registers 7 of the M-sequence generation circuit 6 is set to be 7, an a primitive polynomial to define the character of the M-sequence generation circuit 6 is expressed as $x^7+x+1$. As a result, one cycle has a clock cycle of $(2^m-1)=127$, and the numeric value A takes a value within 0 to 127. The error rate p is defined as $16/127 \cong 1/8$.

Thus, the reference value B that is a fixed value is equal to 16. The predetermined value K in which the first reference value C changes in synchronization with the clock CLK is [2], and the range value E to be added to the first reference value C is [16] which is the same as the reference value B that is the fixed value.

As cleared from FIG. 4, while the reference value generation circuit 12 in the conventional random error signal generator 3 generates the reference value B defined as the fixed value due to the specified error rate, the second reference value generation circuit 24 in the random error signal generator 20 shown in FIG. 1 generates the second reference value D as a value in which the first reference value C(=N×K) to be changed with the increase in the number N of clocks and the first reference value C(=N×K) are added by the range value E defined in correspondence to the specified error rate.

As may be understood from FIG. 4, the first reference value C and the second reference value D in each of the number N of clocks maintain a parallel relationship separately from each other by the range value E, and the interval (range value E) between the first reference value C and the second reference value D corresponds to the reference value B that is a fixed value. Thereby, the probability, in which the numeric value A in each clock CLK input to each one end of the first and the second comparators 21, 22 from the M-sequence generation circuit 6 becomes not smaller than the first reference value C and not larger than the second reference value D, that is, the probability of existing in the range E becomes the targeted error rate p. Therefore, the error rate of the random error signal $b_2$ output from the determination circuit 29 becomes the specified error rate p.

Further, since the range to determine as the occurrence of the error greatly changes according to the number N of clocks, even if the numeric values A input to each one end of the first and the second comparators 21, 22 do not change so much, since the first and the second reference values C, D input to the other ends of the comparators 21, 22 greatly change, the distribution of the error occurrences is not biased. Then, the error distribution may be further approximated to Poisson distribution, and the adjacent error occurrence intervals of the occurred errors may be approximated to the geometric distribution.

Figure 5:
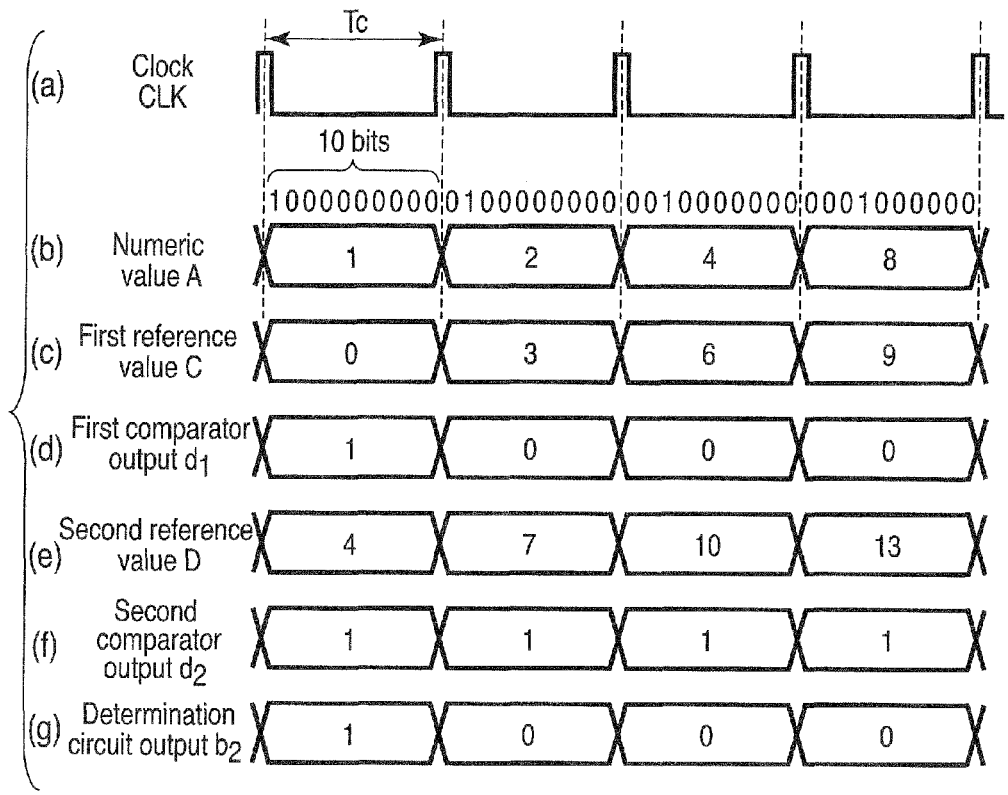
FIG. 5 is a time chart showing an operation in each unit of the random error signal generator shown in FIG. 1.

This will be described with reference to a concrete example in FIG. 5. FIG. 5 shows a time chart illustrating comparison operations among the first comparator 21, the second comparator 22 and the determination circuit 29. It is assumed that each numeric value A, and each reference value C, D input to each input terminal of the first and the second comparators 21, 22 from the M-sequence generation circuit 6, the first reference value generation circuit 23, and the second reference value generation circuit 24 have 10 digits (m=10), respectively.

It is assumed that when one clock CLK is input, if paralleled data of 10 bits (m=10) output form 10 sets of each register 7 of the M-sequence generation circuit 6 is [1000000000], the numeric value E corresponding to the targeted (specified) error rate p is equivalent to [4] that is the same as that of the reference value B.

In the data of 10 bits (m=10) from the M-sequence generation circuit 6 changes, the numeric value A at each one input terminal (X terminal) of each comparator 21, 22 changes in order of [1]→[2]→[4]→[8], . . . , as shown at (b) of FIG. 5, at every time when the clock CLK is input as shown at (a) of FIG. 5.

As shown at (c) of FIG. 5, if the first reference value C changes in order of [0]→[3]→[6]→[9]→(K=3) at every time when the clock CLK is input as shown at (c) of FIG. 5, the second reference value D generated by adding the numeric value (E=4) defined so as to correspond to the error rate p to the first reference value C changes in order of [4]→[7]→[10]→[13]→, ..., as shown at (e) of FIG. 5.

As a result, as shown at (d) of FIG. 5, if the numeric value A at each of the number N of clocks of the first comparator 21 is not smaller than the first reference value C, the lower side determination signal $d_1$ to be [1] changes in order of [1]→[0]→[0]→[0]→, ..., for each of the number N of clocks. Further, the upper side determination signal $d_2$ to be [1] when the numerical value A at each of the number N of clocks of the second comparator 22 is not larger than the second reference value D changes in order of [1]→[1]→[1]→[1]→, ..., for each of the number N of clocks as shown at (f) of FIG. 5.

The error bit of the random error signal $b_2$ both the lower side determination signal $d_1$ and the upper side determination signal $d_2$ of the determination circuit 29 are equivalent to [1] changes in order of [1]→[1]→[1]→[1]→, ..., for each of the number N of clocks as shown at (g) of FIG. 5.

Figure 17:
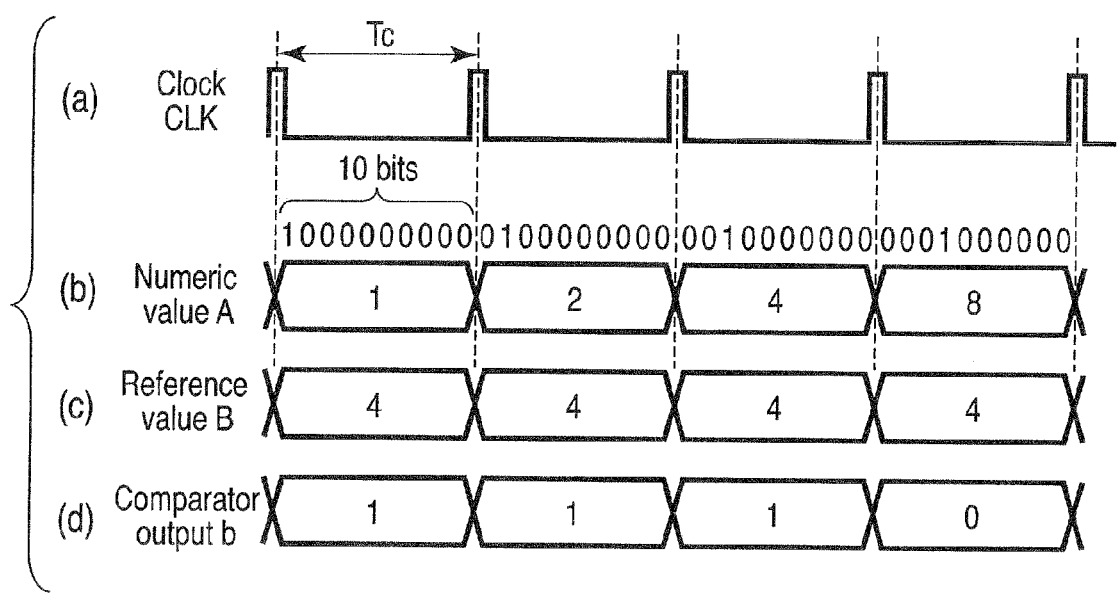
FIG. 17 is a time chart showing an operation at each unit in the conventional random error signal generator shown in FIG. 15.

In this way, the finally obtained error occurrences of the error signal $b_2$ in the random error signal generator 20 of the first embodiment may be greatly distributed in comparison with a case where the error signal generation is performed under the same condition by using the conventional signal generator shown in FIG. 17.

Figure 6:
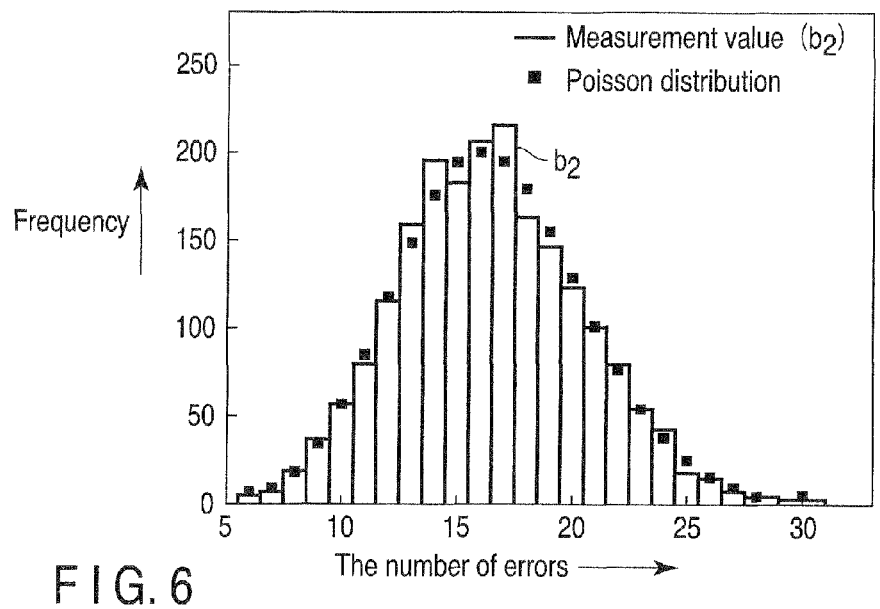
FIG. 6 is a graph showing a counting property of a random error signal generated from the random error signal generator shown in FIG. 1.

FIG. 6 shows a measurement result, within a predetermined counting time, of error occurrence distribution (counting property) of the random error signal $b_2$ generated by the random error signal generator 20 of the first embodiment.

Wherein the number of registers 7 of the M-sequence generation circuit 6: m=25, a primitive polynomial uniquely defining a characteristic of the M-sequence generation circuit 6: $x^{25}+x^3+1$, an error rate: $p=10^{-3}$, transition at the number N of each of the clocks of the first reference value C: (K=1,000)

[0]→[1,000]→[2,000]→[3,000]→[4,000]→A, value E corresponding to an error rate p to he added to the first reference value C: E=33554

The measurement result indicated by a vertical boxes of FIG. 6 has been recognized to be approximated to Poisson distribution indicated by black squares.

Figure 7:
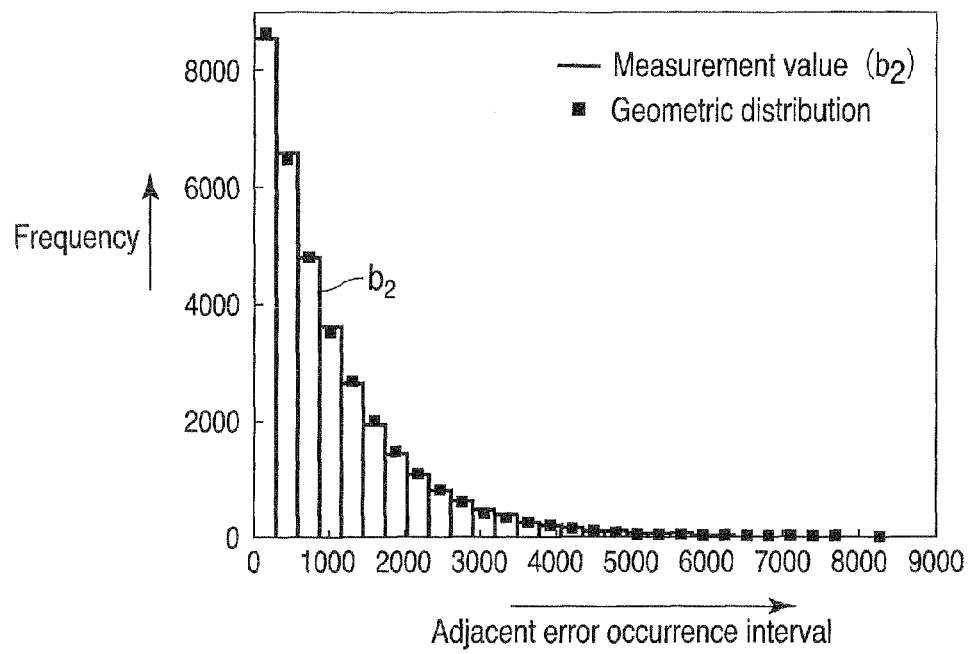
FIG. 7 is a graph showing an interval property of the random error signal generated from the random error signal generator shown in FIG. 1.

FIG. 7 shows a measurement view of a distribution characteristic (interval property) between adjacent error occurrence intervals of the same random error signal $b_2$ from which the measurement result of the error distribution of FIG. 6 has been obtained. From the measurement result shown in FIG. 7, it is recognized that the distribution characteristic approximates the geometric distribution indicated by black squares.

Figure 8:
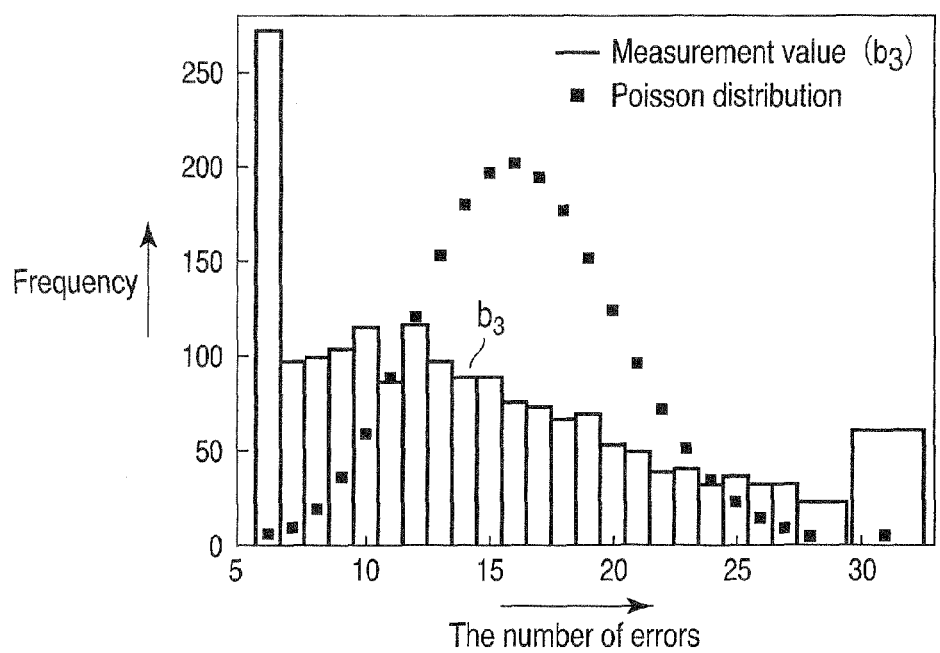
FIG. 8 is a graph showing a counting property of a random error signal generated from the random error signal generator shown in FIG. 1 under a condition with the first reference value fixed therein.
Figure 15:
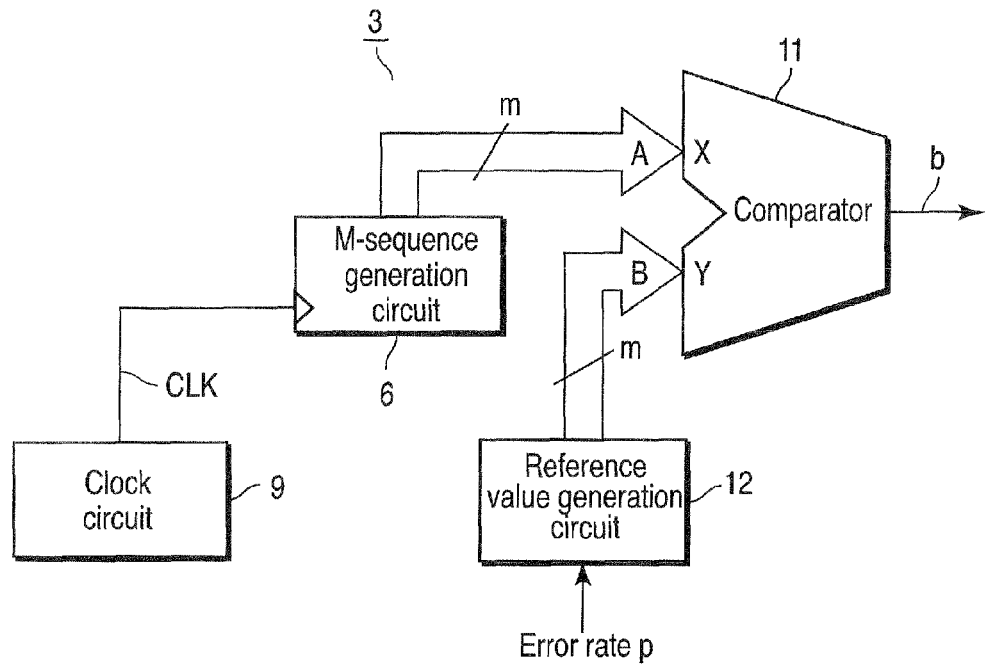
FIG. 15 is a block diagram showing a schematic configuration of the conventional random error signal generator.
Figure 16:
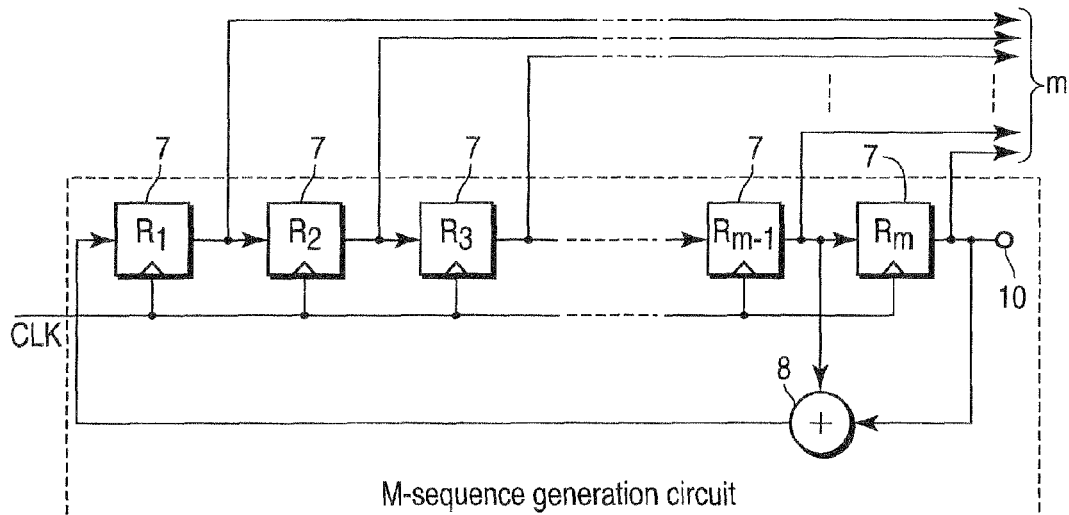
FIG. 16 is a circuit view showing an M-sequence generation circuit incorporated in the random error signal generator shown in FIG. 15.

FIG. 8 shows a view illustrating a measurement result of an error occurrence distribution (counting property) within a predetermined counting time of a random error signal $b_3$ generated under almost the same condition as that of the conventional signal generator of FIG. 15, by setting the first reference value C is set to a fixed value of [C=0] in the first reference value generation circuit 23, therefore, the resulting second reference value D is set to D=E (fixed) in the random error generator of the first embodiment of the invention.

As cleared from this measurement result, the error occurrence distribution (counting property) within the measured predetermined counting time is greatly deviated from Poisson distribution.

Figure 9:
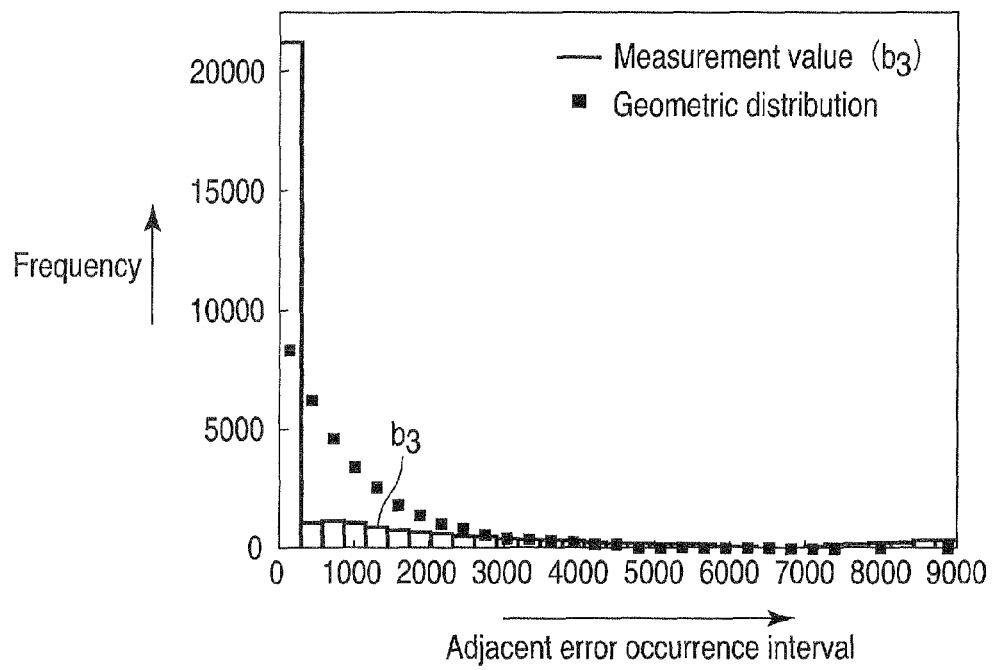
FIG. 9 is a graph showing an interval property of a random error signal generated by from random error signal generator shown in FIG. 1 under a condition with the first reference value fixed therein.

FIG. 9 shows a measurement view of a distribution characteristic (interval property) of adjacent error occurrence intervals of the identical random error signals $b_3$.

Also in the measurement result, it is recognized for the distribution characteristic (interval property) of the measured adjacent error occurrence intervals is greatly deviated from the geometric distribution indicated by black squares.

Especially, in FIG. 9, the measurement value at the leftmost is extremely larger than a value expected by the geometric distribution expresses an occurrence of an phenomenon in which random error signals are concentrated (i.e., adjacent error generation interval is short) and generated at a specific time in the conventional random error signal generator.

In this way, it becomes clear that with an increase in the first and the second reference values C, D at every input of the clock, the number of times of error occurrences in the generated random error signal $b_2$ within a predetermined counting time approximates Poisson distribution and also the occurrence time interval between adjacent two errors approximates the geometric distribution.

In the circuit shown FIG. 1, the first and the second comparators 21, 22 and the determination circuit. 29 may be structured in a module and may be configured by one comparison and determination circuit module.

Second Embodiment

Figure 10:
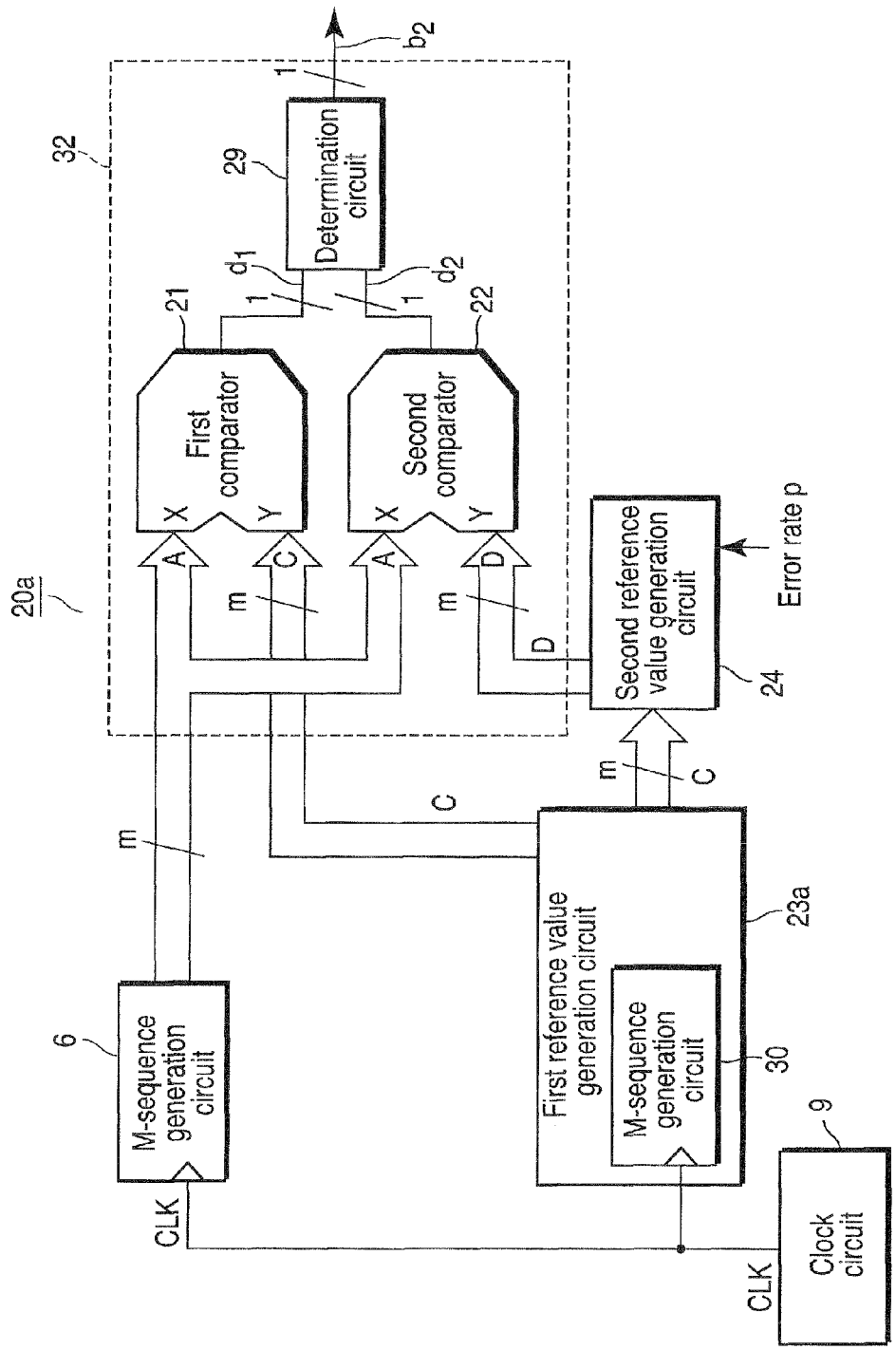
FIG. 10 is a block diagram showing a schematic configuration of a random error signal generator according to a second embodiment of the invention.

FIG. 10 shows a block diagram illustrating a schematic configuration of a random error signal generator according to a second embodiment of the invention. The same components as those of the random error signal generator 20 of the first embodiment of the invention are designated by the identical symbols and the detailed explanation for overlapped components will be omitted.

In the random error signal generator 20a of the second embodiment, a first reference value generation circuit 23a is composed of a second M-sequence generation circuit 30. Other configuration is almost the same as the random error signal generator 20 of the first embodiment shown in FIG. 1.

The second M-sequence generation circuit 30 installed in the first, reference value generation circuit 23a outputs a plurality (m) of pieces (bits) of data in parallel, and the data differs from that the M-sequence generation circuit 6 outputs. While the second M-sequence generation circuit 30 has the same number m of the registers 7 as that of the M-sequence generation circuit 6, and generates pseudo random signals of a $2^m-1$ cycle, the primitive polynomial that determines the characteristic of the M-sequence generation circuit is uniquely made different from that of the M-sequence generation circuit 6 by changing the register 7 of a supply source of bit data to be supplied to the exclusive OR gate 8.

As a result, the second M-sequence generation circuit 30 sends paralleled m pieces (bits) of data of a code sequence, as a first reference value C, differing from that of the M-sequence generation circuit 6 to the other input terminal (Y terminal) of the first comparator 21, and also sends it to the second reference value generation circuit 24.

The second reference value generation circuit 24 generates a second reference value D in which a value E corresponding to an error rate p is added to the first reference value C output from the first reference value generation circuit 23a to send the reference value D to the other input terminal (Y terminal) of the second comparator 22.

Figure 11:
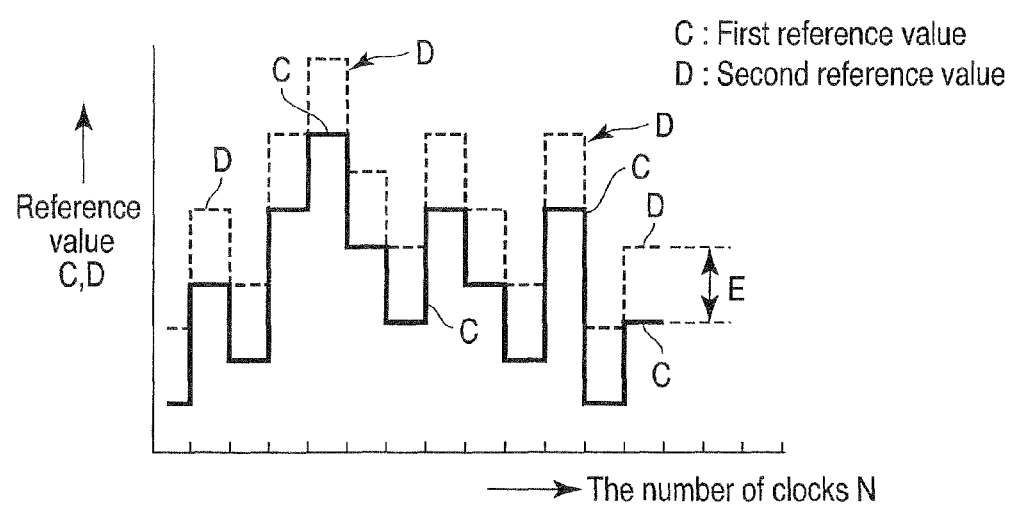
FIG. 11 is an exemplary graph showing a change in each reference value of the first and the second reference value generation circuits in the random error signal generator shown in FIG. 10.

FIG. 11 shows a change in the first reference value C, the second references value D and the number N of each of the clocks. Since the first and the second reference values C, D change step by step (stepwise) at random in a state where the values C, D mutually have a predetermined interval E in correspondence to the number N of each of the clocks, the continuous occurrences of the errors may be prevented.

Therefore, in the random error signal $b_2$ generated by the signal generator 20a of the second embodiment, the number of times of error occurrences within a predetermined counting time approximates Poisson distribution, and time intervals of the occurrences of adjacent two errors approximate a geometric distribution.

Also in the circuit shown in FIG. 10, the first and the second comparators 21, 32 and the determination circuit 29 may be made in a module and may be configured by one comparison and determination circuit. module.

Third Embodiment

FIG. 12 shows a block diagram illustrating a schematic configuration of a random error signal generator according to a third embodiment of the invention. The same components as those of the random error signal generator 20 of the first embodiment of the invention shown in FIG. 1 are designated by the identical symbols and the detailed explanation for overlapped components will be omitted.

In a random error signal generator 20b of the third embodiment, a first reference value generation circuit 23b sends a first reference value $C_1$ of (m−1) digits less than the number m by one digit of parallel bit data output from the M-sequence generation circuit 6 to a low order digit (1, 2, ..., m−1) except the most significant digit (m) at the other input terminal (Y terminal) of the first comparator 21, and sends the reference value $C_1$ to a second reference value generation circuit 24a. A fixed bit value of [0] has been applied to the most significant digit (m) at the other input terminal (Y terminal) of the first comparator 21.

The second reference value generation circuit 24a generates a second reference value $D_1$ of an (m−1)-digit in which a value E defined in correspondence with an error rate p to a first reference value $C_1$ of an (M−1)-digit less by one digit than the number m of pieces (bits) of bit data input in parallel, to send the second reference value $D_1$ to the other input terminal (Y terminal) of the second comparator 22. A fixed it value of [0] is applied to the uppermost digit (m) at the other terminal (Y terminal) of the second comparator 22.

The first and the second comparators 21, 22 take in, as one numeric value A, parallel m pieces (bits) of data applied to one input terminal (X terminal) from the M-sequence generation circuit 6. Similarly, the comparators 21, 22 take in again, as the first reference value $C_1$ and the second reference value $D_1$, data of total m-digit of one digit of the most significant [0] and (m−1)-digit of the first and the second reference values $C_1$ and $D_1$. After this, the final random error signal $b_2$ is obtained in accordance with the procedure which has described for the first embodiment.

In such a random error signal generator 20d of the third embodiment, the first reference value $C_1$ and the second reference value $D_1$ output from the first reference value generation circuit 23b and the second reference value generation circuit 24a, respectively, are defined so as not to exceed a maximum value $2^m$ capable of being set to the numeric value A of m digits input to one input terminals (X terminals) of the first and the second comparators 21, 22. Therefore, the circuit configuration can be made simple, and random error signals with high precision can be generated.

Also in the circuit shown in FIG. 12, the first and the second comparators 21, 22 may be made in modules, and may be configured by one comparison and determination circuit module.

Fourth Embodiment

FIG. 13 shows a block diagram illustrating a schematic configuration of a random error signal generator according to a fourth embodiment of the invention. The same components as those of the random error signal generator 20 of the first embodiment of the invention shown in FIG. 1 are designated by the identical symbols and the detailed explanation for the overlapped components will be omitted.

In a random error signal generator 20c of the fourth embodiment, the first and the second comparators 21, 22 and the determination circuit 29 shown in FIG. 1 are replaced by a comparison and determination unit 32, the comparison and determination unit 32 is provided with three input terminals which are an X input terminal to which parallel m pieces (bits) of data from the M-sequence generation circuit 6 is applied, a Y input terminal to which a first reference value C of m-bit structure from the first reference value generation circuit 23 is applied, and a Z input terminal to which a second reference value D of m-bit structure from the second reference value generation circuit 24 is applied.

The comparison and determination unit 32 takes in, as one numeric value A, bit data of m-bit applied to the X input terminal from the M-sequence generation circuit 6, and outputs a random error signal $b_2$ to be an error bit when the numeric value A exists between the first reference value C input to the Y input terminal and the second reference value D input to the Z input terminal in synchronization with the clock CLK.

In the fourth embodiment, it is enough for the numeric value E corresponding to the error rate p to exist between the first and the second reference values C, D, and a magnitude relationship between the first and the second reference values C, D is not limited particularly.

Even the random error signal generator 20c of the fourth embodiment structured in this way enables having an effect on operation almost the same as that of the random error signal generator 20 of the first embodiment.

As mentioned above, in the invention, the random error signal generator sequentially changes the first and the second reference values in synchronization with the clocks while maintaining the intervals corresponding to the target error rate. Thus, the generator can agree the error rate of the random error signal to be output with the specified error rate, can further approximate the error distribution of the errors to Poisson distribution, and can approximate the adjacent error occurrence intervals to the geometric distribution.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A random error signal generator, comprising:
    a clock circuit which outputs clocks at predetermined cycles;
    a first reference value generation circuit which sequentially outputs first reference values, wherein the first reference values change by a predetermined value at every input of the clocks;
    a second reference value generation circuit which sequentially outputs second reference values in synchronization with the clocks, the second reference values being shifted from the first reference values by a range which is determined depending on a specified error rate;
    an M-sequence generation circuit comprising registers, which outputs a plurality of pieces of bit data stored in the respective registers in response to the clocks; and a comparison and determination unit which outputs random error signals including an error bit or error bits in parallel, wherein the random error signals are generated based on a comparison between the bit data output from the M-sequence generation circuit and the first and second reference values, wherein the comparison and determination unit takes in, as one numeric value, the plurality of pieces of bit data sequentially output from the M-sequence generation circuit in parallel, and takes in the first reference value and the second reference value, and outputs, in synchronization with the clocks, random error signals to be error bits if the numeric value taken from the M-sequence generation circuit exists between the first reference value and the second reference value.

2. The generator according to claim 1, wherein the comparison and determination unit comprises:

a first comparator which receives the plurality of pieces of bit data sequentially output in parallel from the M-sequence generation circuit, takes in the input plurality of pieces of bit data as one numeric value, and outputs a lower side determination signal when the numeric value is equal to or larger than the first reference value input to the first comparator;

a second comparator which receives the plurality of pieces of bit data sequentially output in parallel from the M-sequence generation circuit, takes in the input plurality of pieces of bit data as one numeric value, and outputs an upper side determination signal when the numeric value is equal to or smaller than the second reference value input to the second comparator; and a determination circuit which outputs the random error signals to be the error bits in synchronization with the clocks when the first comparator outputs the lower side determination signal and when the second comparator simultaneously outputs the upper side determination signal.

3. The generator according to claim 2, wherein the M-sequence generation circuit outputs bit data of an m digit number in parallel, the first and the second reference value generation circuits output signals of the first and the second reference values of (m−1) digits, which is smaller than the number of digits of the bit data of the m digit number by one digit, to the comparison and determination unit, and the first and the second comparators receive fixed values of [0] as the most significant digits.

4. The generator according to claim 2, further comprising:
a setting unit to set the predetermined value by which the first reference values change at every input of the clocks.

5. The generator according to claim 1, wherein the M-sequence generation circuit outputs bit data of an m digit number in parallel, the first and the second reference value generation circuits output, to the comparison and determination unit, the first and the second reference values of (m−1) digits, which is smaller than the number of digits of the bit data of the m digit number by one digit, and the comparison and determination unit receives fixed values of [0] as the most significant digits.

6. The generator according to claim 5, further comprising:
a setting unit to set the predetermined value by which the first reference values change at every input of the clocks.

7. The generator according to claim 1, further comprising:
a setting unit to set the predetermined value by which the first reference values change at every input of the clocks.

* * * * *